(12) United States Patent
Chang et al.

(10) Patent No.: US 8,860,101 B2
(45) Date of Patent: Oct. 14, 2014

(54) IMAGE SENSOR CROSS-TALK REDUCTION SYSTEM

(75) Inventors: Lan Fang Chang, Dapi Township (TW); Ching-Hwanq Su, Tainan (TW); Wei-Ming You, Taipei (TW); Chih-Cherng Jeng, Madou Township (TW); Chih-Kang Chao, Tainan (TW); Fu-Sheng Guo, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 90 days.

(21) Appl. No.: 13/406,363

(22) Filed: Feb. 27, 2012

(65) Prior Publication Data

US 2013/0207220 A1    Aug. 15, 2013

Related U.S. Application Data

(60) Provisional application No. 61/598,652, filed on Feb. 14, 2012.

(51) Int. Cl.
*H01L 31/062*  (2012.01)

(52) U.S. Cl.
USPC ............ 257/292; 257/291; 257/432; 257/461

(58) Field of Classification Search
USPC .................. 257/291, 292, 461, 432, E27.133
See application file for complete search history.

(56) References Cited

U.S. PATENT DOCUMENTS

| | | | | |
|---|---|---|---|---|
| 7,030,918 | B1* | 4/2006 | Nakashiba | 348/294 |
| 7,633,134 | B2* | 12/2009 | Hynecek | 257/440 |
| 2005/0199922 | A1* | 9/2005 | Park | 257/292 |
| 2006/0244020 | A1* | 11/2006 | Lee | 257/291 |
| 2007/0018075 | A1* | 1/2007 | Cazaux et al. | 250/208.1 |
| 2007/0194356 | A1* | 8/2007 | Moon et al. | 257/291 |
| 2008/0211047 | A1* | 9/2008 | Iida | 257/432 |
| 2009/0200585 | A1* | 8/2009 | Nozaki et al. | 257/292 |
| 2009/0312786 | A1* | 12/2009 | Trask et al. | 606/192 |
| 2011/0266645 | A1 | 11/2011 | Chao | |

\* cited by examiner

*Primary Examiner* — Bilkis Jahan
(74) *Attorney, Agent, or Firm* — Slater and Matsil, L.L.P.

(57) ABSTRACT

A system and method for reducing cross-talk between photosensitive diodes is provided. In an embodiment an isolation region comprising a first concentration of dopants is located between the photosensitive diodes. The photosensitive diodes have a second concentration of dopants that is less than the first concentration of dopants, which helps to prevent diffusion from the photosensitive diodes to form a potential path for undesired cross-talk between the photosensitive diodes.

20 Claims, 9 Drawing Sheets

IMAGE SENSOR CROSS-TALK REDUCTION SYSTEM

This application claims the benefit of U.S. Provisional Application No. 61/598,652, filed on Feb. 14, 2012, entitled "Image Sensor Cross-Talk Reduction System and Method," which application is hereby incorporated herein by reference.

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In a back-side illumination configuration, the transfer transistor, the metal layers, and the dielectric layers are formed on the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

However, pixel regions that are adjacent to each other may interfere with each other's operation in what is known as cross-talk. Such cross-talk can reduce the precision and efficiency of the image sensor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a complementary metal oxide semiconductor (CMOS) back side illuminated image sensor. Other embodiments may also be applied, however, to other image sensors and other semiconductor devices.

Figure 1:
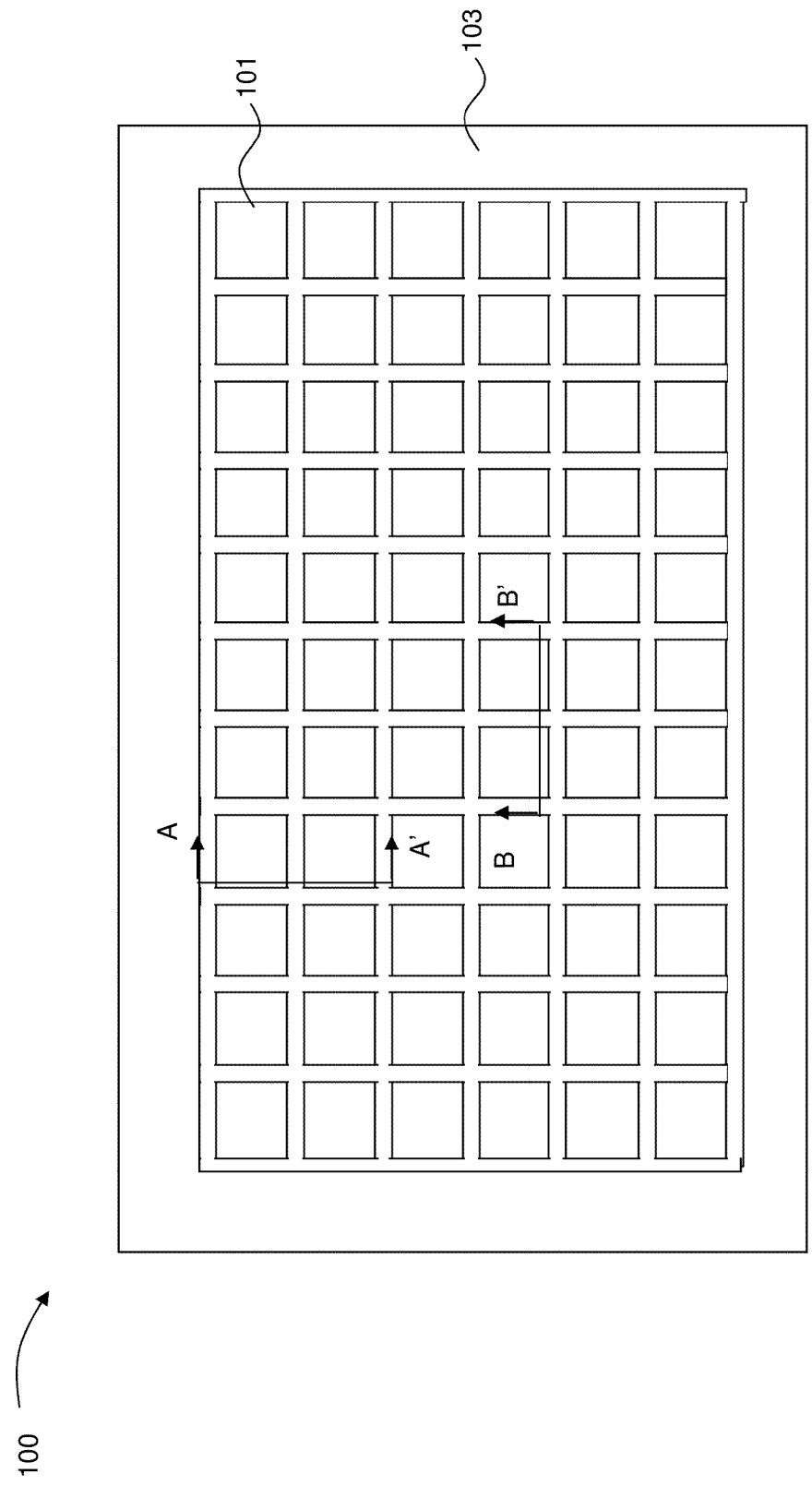
FIG. 1 illustrates an image sensor with an array of pixel regions in accordance with an embodiment.

With reference now to FIG. 1, there is shown an image sensor 100 which comprises a grid or array of backside illuminated pixel regions 101. The image sensor 100 also may comprise a logic region 103 located adjacent to the array of pixel regions 101. The logic region 103 may have additional circuitry and contacts for input and output connections to and from the array of pixel regions 101. The logic region 103 is utilized to provide an operating environment for the pixel regions 101 and to moderate communications between the array of pixel regions 101 and other external devices (not shown).

Figure 2A:
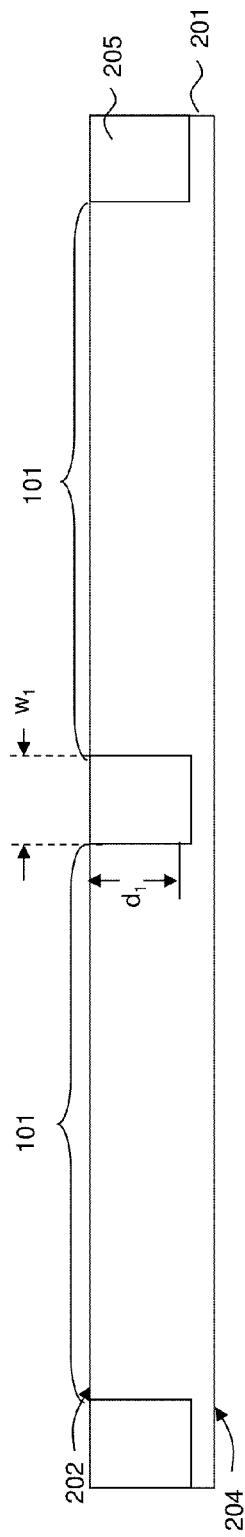
FIGS. 2A-2C illustrate cross-sectional views of the image sensor with isolation regions in accordance with an embodiment.
Figure 2B:
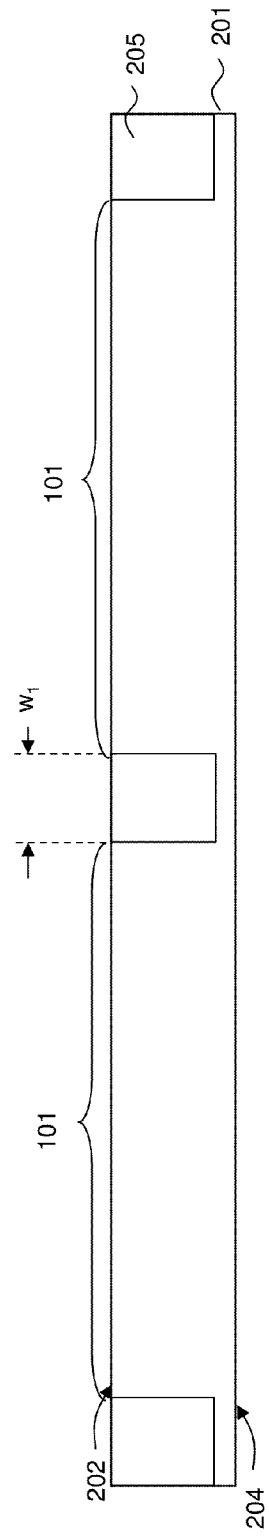

FIGS. 2A-2B illustrate simplified cross sectional views of adjacent pixel regions 101 through lines A-A' and B-B' in FIG. 1, respectively, and show a substrate 201 with two pixel regions 101 separated by isolation regions 205. The substrate 201 may comprise a front side 202 and a back side 204 and may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 201 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 201 may be doped with a p-type dopant, such as boron, aluminum, gallium, or the like, although the substrate may alternatively be doped with an n-type dopant, as is known in the art.

The isolation regions 205 may be located within the substrate 201 between the individual pixel regions 101 in order to separate and isolate the pixel regions 101 and the photosensitive diodes 301 (not illustrated in FIGS. 2A-2B but illustrated and discussed below with respect to FIGS. 3A-3B) from each other. The isolation regions 205 may be formed from a material that can be used to isolate and limit the interaction between the pixel regions 101 and the photosensitive diodes 301, and in an embodiment may comprise dopants that can help to isolate the photosensitive diodes 301. For example, the isolation regions 205 may comprise dopants of a similar conductivity as the substrate 201, so that, if the substrate 201 is a p-type substrate, then the isolation regions 205 may comprise a p-type dopant such as boron, gallium, indium, combinations of these, or the like, although any other suitable dopant that can assist in the isolation of the pixel regions 101 and the photosensitive diodes 301 may alternatively be utilized.

In an embodiment the isolation regions 205 may be formed using a photolithographic masking and implantation process. In such a process a first photoresist (not shown in FIGS. 2A-2B) may be placed on the substrate 201. The first photoresist may comprise a conventional photoresist material, such as a deep ultra-violet (DUV) photoresist, and may be deposited on the surface of the substrate 201, for example, by using a spin-on process to place the first photoresist. However, any other suitable material or method of forming or placing the first photoresist may alternatively be utilized. Once the first photoresist has been placed on the substrate 201, the first photoresist may be exposed to energy, e.g. light, through a patterned reticle in order to induce a reaction in those portions of the first photoresist exposed to the energy. The first photoresist may then be developed, and portions of the first photoresist may be removed, exposing a surface of the substrate 201 where the isolation regions 205 are desired.

Once the surface of the substrate 201 has been exposed, the isolation regions 205 may be formed using a process such as ion implantation through the first photoresist. In an embodiment in which boron is implanted, the ion implantation of the dopants for the isolation regions 205 may be performed using such as precursor of $BF_3$, at a flow rate of between about 0.5~1.0 sccm. With the precursors supplied, the implantation source head Arc current may be performed about 45~75 V, while the chiller temperature may be held below 60° C. The implantation to form the isolation regions 205 may be continued until the isolation regions 205 have a concentration of between 1e16~1e17 atom/cm³, at a first depth $d_1$ from the front side 202 to which the substrate 201 will eventually be thinned (although the isolation regions 205 may extend further than the first depth after the implantation). For example, in an embodiment in which the substrate 201 will be thinned to a thickness of about 2.15 μm, the isolation regions 205 may be implanted to have a concentration of about 1e16 atom/cm³ at a first depth $d_1$ of about 2.15 μm. The isolation regions 205 may be formed to have a first width $w_1$ of about 0.25 μm.

Figure 2C:
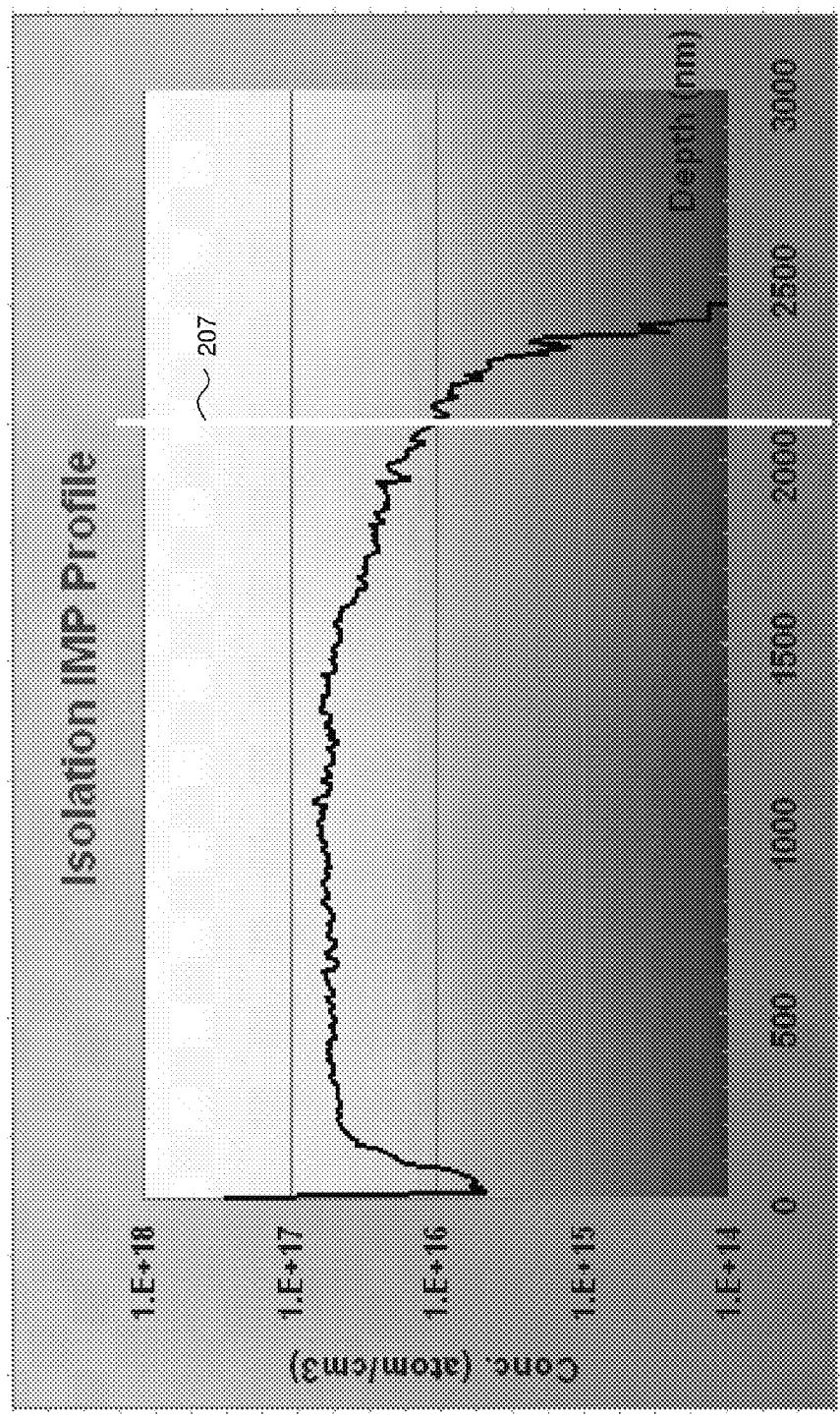

FIG. 2C illustrates one example of an implantation profile for the isolation regions 205 in accordance with an embodiment as described above with respect to FIGS. 2A-2B. In this figure the line labeled 207 represents the first depth $d_1$, which in an embodiment may be about 2.15 μm. In this embodiment the isolation region 205 has a dopant concentration of about 1e16 atom/cm³ at 2.15 μm.

Once the isolation regions 205 have been formed, the first photoresist may be removed. In an embodiment the first photoresist may be removed using a process such as ashing, whereby the temperature of the first photoresist is increased until the first photoresist decomposes and may be removed. However, the embodiments are not intended to be limited to ashing, as any other suitable process may alternatively be utilized to remove the first photoresist.

Figure 3A:
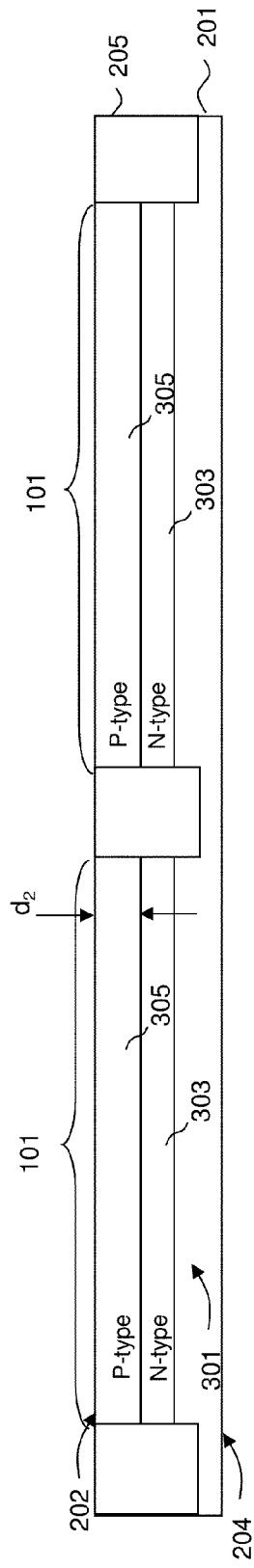
FIGS. 3A-3C illustrate cross-sectional views of the image sensor with photosensitive diodes in accordance with an embodiment.
Figure 3B:
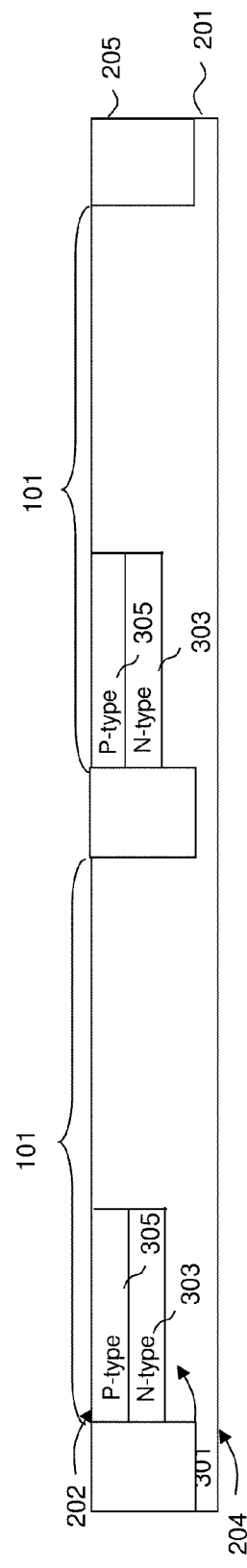

FIGS. 3A-3B illustrate the formation of photosensitive diodes 301 in the respective pixel regions 101, with FIG. 3A illustrating a cross-section through line A-A' in FIG. 1 and FIG. 3B illustrating a cross-section through line B-B' in FIG. 1. The photosensitive diodes 301 may extend across the entire pixel regions 101 in a first cross-section (e.g., the cross section along A-A' in FIG. 1), while in another direction the photosensitive diodes 301 may extend across only a portion of the pixel regions 101 in order to leave room for other devices within the pixel regions 101 such as a transfer transistor 500 (not illustrated in FIGS. 3A-3B but illustrated and discussed below with respect to FIG. 5).

The photosensitive diodes 301 may be utilized to generate a signal related to the intensity or brightness of light that impinges on the photosensitive diodes 301. In an embodiment the photosensitive diodes 301 may comprise n-type doped regions 303 formed in the substrate 201 (which in this embodiment may be a p-type substrate) and also may comprise heavily doped p-type doped regions 305 formed on the surface of the n-type doped regions 303 to form a p-n-p junction.

The heavily doped n-type regions 303 may be formed, e.g., using a photolithographic masking and implantation process. For example, a second photoresist (not shown in FIGS. 3A-3B) may be placed on the substrate 201. The second photoresist, similar to the first photoresist, may comprise a conventional photoresist material, such as a deep ultra-violet (DUV) photoresist, and may be deposited on the surface of the substrate 201, for example, by using a spin-on process to place the second photoresist. However, any other suitable material or method of forming or placing the second photoresist may alternatively be utilized. Once the second photoresist has been placed on the substrate 201, the second photoresist may be exposed to energy, e.g. light, through a patterned reticle in order to induce a reaction in those portions of the second photoresist exposed to the energy. The second photoresist may then be developed, and portions of the second photoresist may be removed, exposing a portion of the substrate 201 where the photosensitive diodes 301 are desired to be located.

Once the second photoresist has been placed and developed, the heavily doped n-type doped regions 303 may be formed by implanting n-type dopants (e.g., phosphorous, arsenic, antimony, or the like) through the second photoresist. In an embodiment the n-type doped regions 303 may be implanted such that their concentration at the first depth $d_1$ of the substrate 201 is less than the concentration in the isolation regions 205 while still remaining at a suitable concentration for operation. For example, in an embodiment in which the isolation regions 205 have a concentration at the first depth $d_1$ of about 1e16 atom/cm³, the n-type doped regions 303 may have a concentration of dopants at the first depth $d_1$ of about 8e15 atom/cm³.

To obtain the desired concentration, the implantation of the n-type doped regions 303 may be performed using a precursor such as $PH_3$ at a flow rate of about 1.2~2.0 sccm. With the precursor supplied, the implantation source head Arc current may be performed about 45~65 V, while the chiller temperature may be held below 60° C. The implantation to form the n-type doped regions 303 may be continued until the n-type doped regions 303 have a concentration of about 8e15~1e17 atom/cm³ at the first depth $d_1$ from the front side 202 to which the substrate 201 will eventually be thinned.

After the n-type doped regions 303 have been formed (e.g., through the implantation process), the p-type doped regions 305 may be formed using, e.g., an ion implantation process using the second photoresist as a mask. The p-type doped regions 305 may be formed to extend into the substrate 201 a second distance $d_2$ of between about 1.6~2.15 μm. Additionally, the p-type doped regions 305 may be formed to have a concentration of between about 5e15~1e16 atom/cm³. To obtain the desired concentration, the implantation of the p-type doped regions 305 may be performed using a precursor such as $BF_3$ at a flow rate of between about 1.2~2.0 sccm. With the precursors supplied, the implantation source head Arc current may be performed about 45~65 V, while the chiller temperature may be held below 60° C.

Once the photosensitive diodes 301 have been formed, the second photoresist may be removed. In an embodiment the second photoresist may be removed using a process such as ashing, whereby the temperature of the second photoresist is increased until the second photoresist decomposes and may be removed. However, the embodiments are not intended to be limited to ashing, as any other suitable process may alternatively be utilized to remove the second photoresist.

Figure 3C:
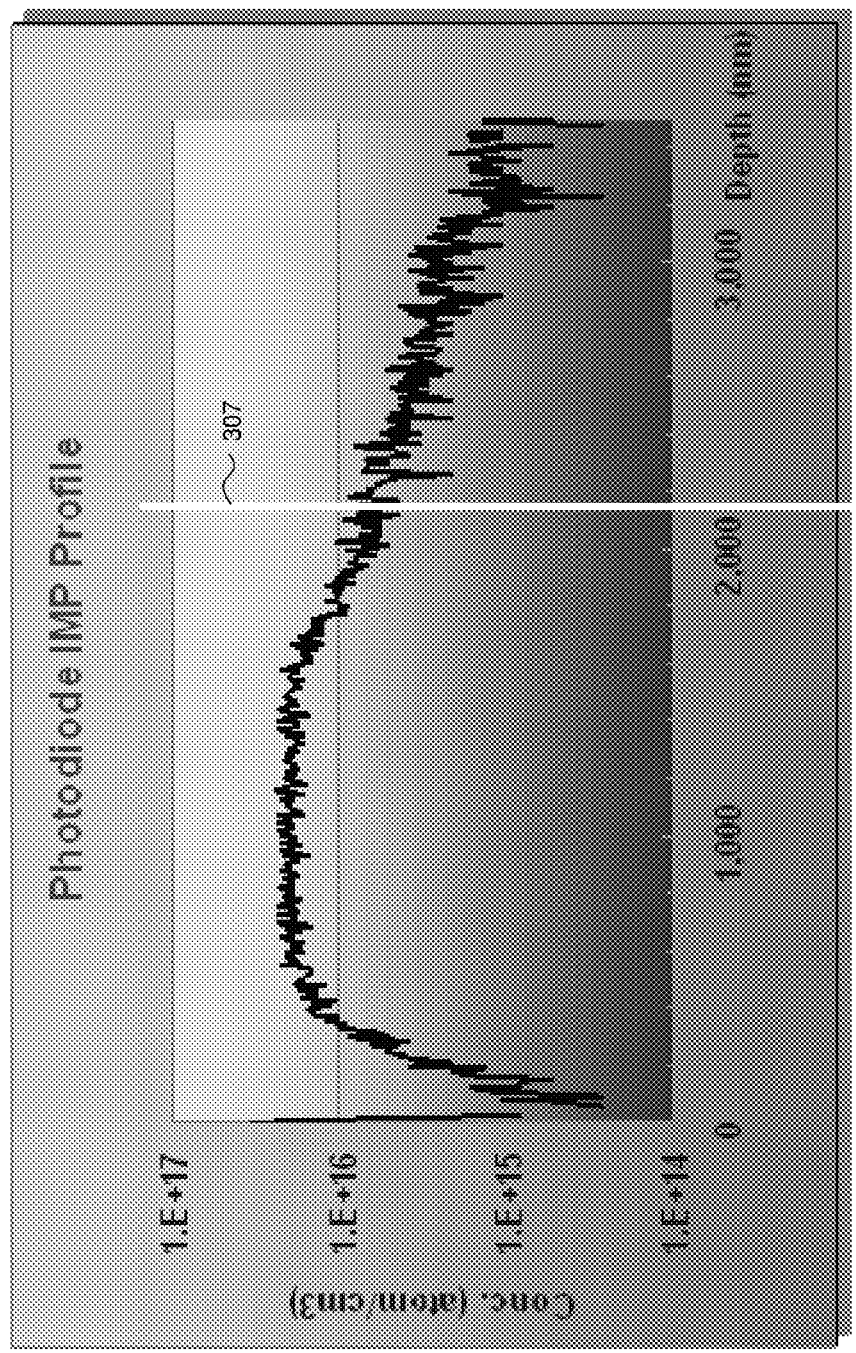

FIG. 3C illustrates one example of an implantation profile for the photosensitive diodes 301 in an embodiment such as the one described above with respect to FIGS. 3A-3B. In FIG. 3C the line labeled 307 represents the first depth $d_1$, which in an embodiment may be about 2.15 µm. In this embodiment the photosensitive diode 301 has a dopant concentration of about 8e15 atoms/cm$^3$ at 2.15 µm, which is less than the dopant concentration of the isolation regions 205 as illustrated in FIG. 2C above.

Further, as one of ordinary skill in the art will recognize, the photosensitive diodes 301 described above are merely one type of photosensitive diodes 301 that may be used in the embodiments. For example, a pinned layer photodiode may alternatively be used. Any suitable photodiode may be utilized with the embodiments, and all of these photodiodes are intended to be included within the scope of the embodiments. Additionally, the precise methods or order of steps described above may be modified, such as by forming the p-type doped regions 305 prior to the formation of the n-type doped regions 303, while still remaining within the scope of the embodiments.

Figure 4A:
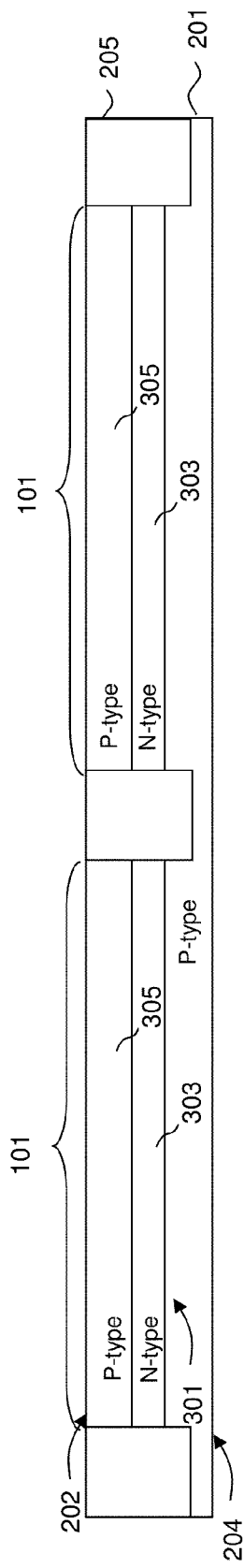
FIGS. 4A-4B illustrate cross-sectional views of the image sensor with gate stacks in accordance with an embodiment.
Figure 4B:
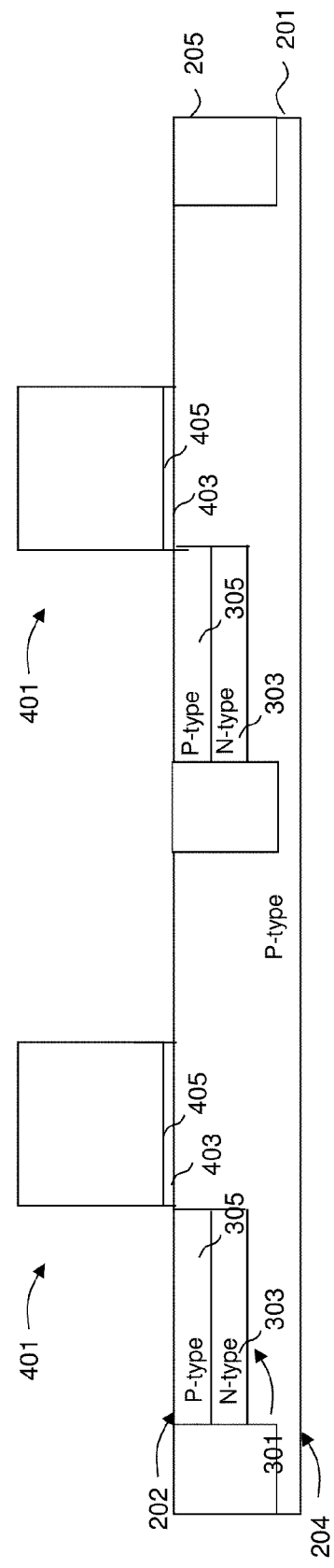

FIG. 4A-4B illustrate the formation of gate stacks 401 for transfer transistors 500 (not fully illustrated in FIGS. 4A-4B but illustrated below with respect to FIG. 5), with FIG. 4A illustrating a cross-section through line A-A' in FIG. 1 and FIG. 4B illustrating a cross-section through line B-B' in FIG. 1. The gate stacks 401 may each comprise a gate dielectric 403 and a gate electrode 405. Gate dielectrics 403 and gate electrodes 405 may be formed and patterned on the substrate 201 by any suitable process known in the art. The gate dielectrics 403 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectrics 403 may have a relative permittivity value greater than about 4.

In an embodiment in which the gate dielectrics 403 comprise an oxide layer, the gate dielectrics 403 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectrics 403 may be between about 10 Å to about 150 Å in thickness, such as 100 Å in thickness.

The gate electrodes 405 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrodes 405 is poly-silicon, the gate electrodes 405 may be formed by depositing doped or undoped poly-silicon by low-pressure chemical vapor deposition (LPCVD) to a thickness in the range of about 100 Å to about 2,500 Å, such as 1,200 Å.

Figure 5:
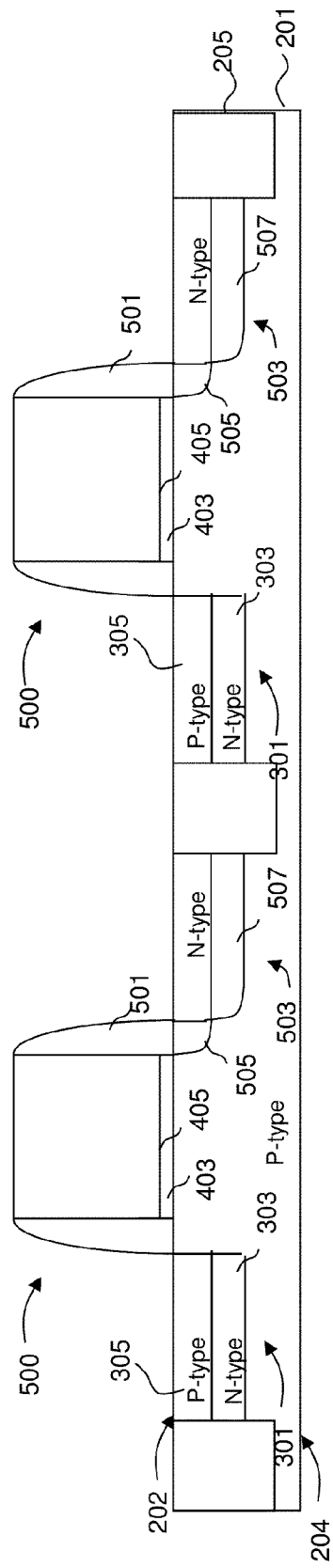
FIG. 5 illustrates the formation of transfer transistors in accordance with an embodiment.

FIG. 5 illustrates additional processing that may be performed relative to the gate stacks 401 to form transfer transistors 500, such as the formation of spacers 501 and source/drain regions 503. The spacers 501 may be formed on the sidewalls of the gate dielectrics 403 and the gate electrodes 405. The spacers 501 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 501, such as by anisotropically etching to remove the spacer layer from the horizontal surfaces of the structure.

Source/drain regions 503 may be formed in the substrate 201 on an opposing side of the gate dielectrics 403 from the photosensitive diodes 301. In an embodiment in which the substrate 201 is a p-type substrate, the source/drain regions 503 may be formed by implanting appropriate n-type dopants such as phosphorous, arsenic, antimony, or the like. The source/drain regions 503 may be implanted using the gate electrodes 405 and the spacers 501 as masks to form lightly doped source/drain (LDD) regions 505 and heavily doped source/drain regions 507.

It should be noted that one of ordinary skill in the art will realize that many other processes, steps, or the like may be used to form the source/drain regions 503 and the photosensitive diodes 301. For example, one of ordinary skill in the art will realize that a plurality of implants may be performed using various combinations of spacers and liners to form the source/drain regions 503 and the photosensitive diodes 301 having a specific shape or characteristic suitable for a particular purpose. Any of these processes may be used to form the source/drain regions 503 and the photosensitive diodes 301, and the above description is not meant to limit the embodiments to the steps presented above.

Figure 6:
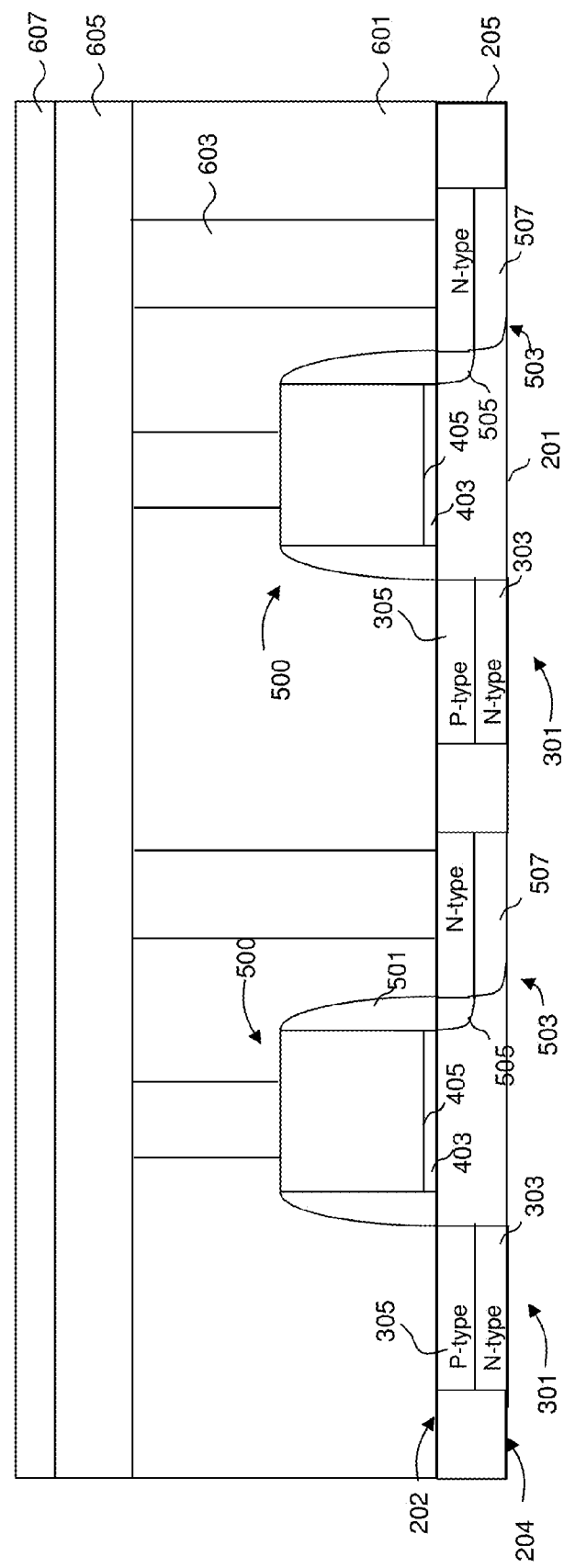
FIG. 6 illustrates processing that may be performed on the front side of the substrate in accordance with an embodiment.

FIG. 6 illustrates the formation of a first inter-layer dielectric (ILD) layer 601 over the pixel regions 101 and the formation of contacts 603 through the first ILD layer 601. The first ILD layer 601 may comprise a material such as boron phosphorous silicate glass (BPSG), although any suitable dielectrics may be used for either layer. The first ILD layer 601 may be formed using a process such as PECVD, although other processes, such as LPCVD, may alternatively be used. The first ILD layer 601 may be formed to a thickness of between about 100 Å and about 3,000 Å.

The contacts 603 may be formed through the first ILD layer 601 with suitable photolithography and etching techniques. Generally, these photolithography techniques involve depositing a photoresist material, which is masked, exposed, and developed to expose portions of the first ILD layer 601 that are to be removed. The remaining photoresist material protects the underlying material from subsequent processing steps, such as etching. In an embodiment photoresist material is utilized to create a patterned mask to define contacts 603. Additional masks, such as a hardmask, may also be used. The first etching process may be an anisotropic or isotropic etch process.

Contacts 603 may then be formed so as to contact the substrate 201 and the gate electrodes 405. The contacts 603 may comprise a barrier/adhesion layer (not individually shown in FIG. 6) to prevent diffusion and provide better adhesion for the contacts 603. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 603 may be formed of any suitable conductive material, such as a highly-conductive, low-resistive metal, elemental metal, transition metal, or the like. In an exemplary embodiment the contacts 603 are formed of tungsten, although other materials, such as copper, could alternatively be utilized. In an embodiment in which the contacts 603 are formed of tungsten, the contacts 603 may be deposited by CVD techniques known in the art, although any method of formation could alternatively be used.

After the contacts 603 are formed, further processing of the front side 202 of the substrate 201 may be performed. This processing may comprise forming various conductive and dielectric layers (collectively referred to in FIG. 6 by the reference number 605) in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the first ILD layer 601, a passivation layer 607 may be formed in order to protect the underlying layers from physical and chemical damage. The passivation layer 607 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 607 may be formed through a process such as chemical vapor deposition (CVD), although any suitable process may be utilized.

After processing of the front side 202 of the substrate 201 has been performed as desired, the thickness of the back side 204 of the substrate 201 may reduced, or thinned. Thinning reduces the distance that light travels through the back side 204 of the substrate 201 before it reaches the photosensitive diodes 301. The thinning of the back side 204 of the substrate 201 may be performed using a removal process such as chemical mechanical polishing (CMP). In a CMP process, a combination of etching materials and abrading materials are put into contact with the back side 204 of the substrate 201 and a grinding pad (not shown) is used to grind away the back side 204 of the substrate 201 until a desired thickness is achieved. However, any suitable process for thinning the back side 204 of the substrate 201, such as etching or a combination of CMP and etching, may alternatively be used. The back side 204 of the substrate 201 may be thinned so that the substrate 201 has a thickness of between about 2~2.3 μm.

Once the substrate 201 has been thinned, the isolation regions 205 have a higher concentration of dopants than the photosensitive diodes 301 along the back side 204 of the substrate 201. Having such a higher dopant concentration can help to mitigate the effects of dopants diffusing from the photosensitive diodes 301 into the isolation regions 205. By mitigating or reducing the effects of the diffusion, cross-talk between adjacent photosensitive diodes 301 may be reduced, helping the image sensor 100 to be more efficient with fewer problems.

Figure 7:
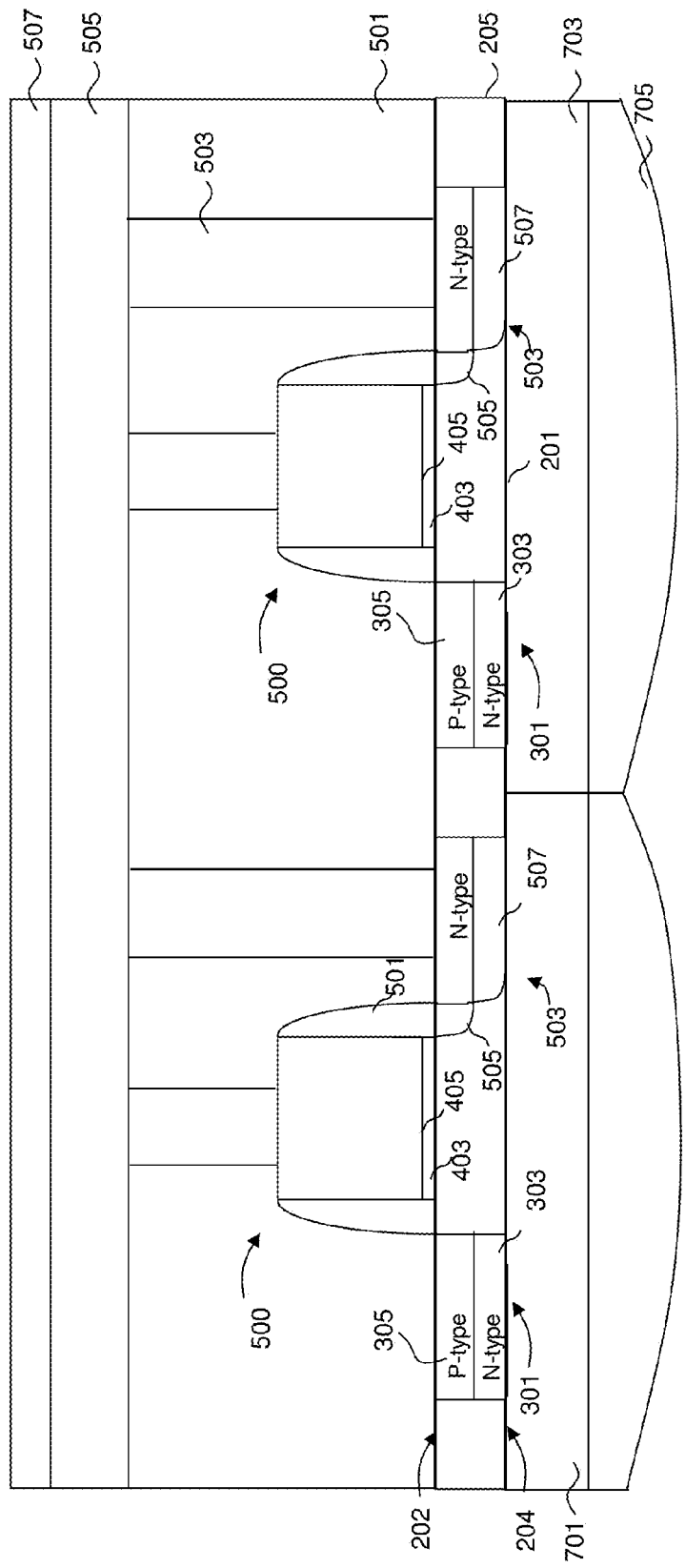
FIG. 7 illustrates processing that may be performed on the back side of the substrate in accordance with an embodiment.

FIG. 7 illustrates the formation of a first color filter 701, a second color filter 703, and microlenses 705 on the back side 204 of the substrate 201. The first color filter 701 and the second color filter 703 may comprise filters for one of the primary colors (e.g., red, green, blue) and may be positioned to filter the light that will impinge upon the photosensitive diodes 301. The first color filter 701 and the second color filter may comprise a polymeric material or resin, such as a polymeric polymer, which includes colored pigments. In an embodiment, the first color filter 701 may be formed over one photosensitive diode 301 and the second color filter 703 may be formed over an adjacent photosensitive diode 301, and the first color filter 701 may filter a different type of light than the second color filter 703, although any desired combination of filters may alternatively be utilized.

The microlenses 705 may be formed opposite the first color filter 701 and the second color filter 703 from the substrate 201, and may be used to focus impinging light more directly onto the photosensitive diodes 301. The microlenses 705 may be formed by first applying and patterning a positive type photoresist (not shown) over the first color filter 701 and the second color filter 703. Once formed, the patterned photoresist may then be baked to round the photoresist into the curved microlenses 705.

In accordance with an embodiment, a semiconductor device comprising an isolation region extending from a first side of a substrate to a second side of the substrate, the isolation region having a first concentration of first dopants adjacent to the second side of the substrate, is provided. A first photosensitive diode is adjacent to the isolation region, wherein the first photosensitive diode has a second concentration of second dopants adjacent to the second side of the substrate, the first concentration of first dopants being higher than the second concentration of second dopants, wherein the first dopants have a different conductivity than the second dopants.

In accordance with another embodiment, a semiconductor device comprising a first photosensitive diode in a first pixel region of a substrate and a second photosensitive diode in a second pixel region of the substrate is provided. An isolation region is between the first photosensitive diode and the second photosensitive diode, wherein the isolation region has a concentration of dopants higher than the first photosensitive diode and the second photosensitive diode adjacent to a back side of the substrate.

In accordance with yet another embodiment, a method of manufacturing a semiconductor device comprising implanting an isolation region within a substrate, the implanting the isolation region implanting ions through a first side of the substrate and forming a first concentration of first dopants at a first depth within the substrate, is provided. A photosensitive diode is implanted adjacent to the isolation region; the implanting the photosensitive diode forming a second concentration of second dopants, the second concentration of dopants being less than the first concentration of dopants, and a second side of the substrate opposite the first side of the substrate is thinned, the thinning the second side of the substrate reducing a thickness of the substrate to the first depth.

Although the present embodiments and their advantages have been described in detail, it should be understood that various changes, substitutions and alterations can be made herein without departing from the spirit and scope of the embodiments as defined by the appended claims. For example, charge coupled devices (CCD) may be utilized in place of the CMOS devices within the image sensor, different materials may be utilized for the silicide contacts, or different methods of formation may be utilized for the various layers of material. These devices, steps and materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   an isolation region extending from a first side of a substrate to a second side of the substrate, the isolation region having a first concentration of first dopants adjacent to the second side of the substrate; and
   a first photosensitive diode extending from the first side of the substrate to the second side of the substrate, wherein the first photosensitive diode is planar with the second side of the substrate, the first photosensitive diode being adjacent to the isolation region, wherein the first photosensitive diode has a second concentration of second dopants adjacent to the second side of the substrate, the first concentration of first dopants being higher than the second concentration of second dopants, wherein the first dopants have a different conductivity than the second dopants.

2. The semiconductor device of claim 1, further comprising a second photosensitive diode adjacent to the isolation region, the second photosensitive diode located opposite the isolation region from the first photosensitive diode, wherein the second photosensitive diode has a third concentration of third dopants adjacent to the second side of the substrate, the first concentration of first dopants being higher than the third concentration of third dopants.

3. The semiconductor device of claim 1, wherein the substrate has a thickness of about 2.15 μm.

4. The semiconductor device of claim 1, further comprising logic devices formed on the first side of the substrate.

5. The semiconductor device of claim 1, wherein the first concentration is between about 1e16 and about 1e17 atom/cm$^3$.

6. The semiconductor device of claim 1, wherein the first dopants are boron.

7. The semiconductor device of claim 6, wherein the second dopants are phosphorous.

8. A semiconductor device comprising:
   a first photosensitive diode in a first pixel region of a substrate;
   a second photosensitive diode in a second pixel region of the substrate; and
   an isolation region between the first photosensitive diode and the second photosensitive diode, wherein the isolation region is planar with the first photosensitive diode along a back side of the substrate and has a concentration of dopants higher than the first photosensitive diode and the second photosensitive diode adjacent to the back side of the substrate.

9. The semiconductor device of claim 8, wherein the isolation region comprises boron dopants.

10. The semiconductor device of claim 9, wherein the first photosensitive diode comprises phosphorous dopants.

11. The semiconductor device of claim 8, wherein the isolation region has a first concentration of dopants between about 1e16 and about 1e17 atom/cm$^3$.

12. The semiconductor device of claim 11, wherein the first photosensitive diode has a second concentration of dopants between about 1e15 and about 1e17 atom/cm$^3$.

13. The semiconductor device of claim 8, further comprising a transfer transistor formed along a front side of the substrate, wherein the front side of the substrate faces away from the back side of the substrate.

14. The semiconductor device of claim 13, wherein a distance between the front side of the substrate and the back side of the substrate is about 2.15 μm.

15. A semiconductor device comprising:
   a substrate with a first height;
   a transfer transistor located along a first side of the substrate;
   a photosensitive diode with at least the first height, the photosensitive diode comprising first dopants with a first concentration located along a second side of the substrate; and
   an isolation region with at least the first height, the isolation region comprising second dopants with a different conductivity than the first dopants, the second dopants having a second concentration larger than the first concentration along the second side of the substrate, the second concentration being larger than the first concentration.

16. The semiconductor device of claim 15, wherein the first height is about 2.15 μm.

17. The semiconductor device of claim 15, wherein the second dopants comprise boron dopants.

18. The semiconductor device of claim 17, wherein the first photosensitive diode comprises phosphorous dopants.

19. The semiconductor device of claim 15, wherein the isolation region the second concentration is between about 1e16 and about 1e17 atom/cm$^3$.

20. The semiconductor device of claim 19, wherein the first concentration is between about 1e15 and about 1e17 atom/cm$^3$.

* * * * *